US012586748B2

(12) United States Patent
Sugiyama et al.

(10) Patent No.: US 12,586,748 B2
(45) Date of Patent: Mar. 24, 2026

(54) STRUCTURE FOR PARTICLE ACCELERATION AND CHARGED PARTICLE BEAM APPARATUS

(71) Applicant: Hitachi High-Tech Corporation, Tokyo (JP)

(72) Inventors: Ryo Sugiyama, Tokyo (JP); Kenji Tanimoto, Tokyo (JP); Shuhei Ishikawa, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 393 days.

(21) Appl. No.: 18/559,160

(22) PCT Filed: May 21, 2021

(86) PCT No.: PCT/JP2021/019451
§ 371 (c)(1),
(2) Date: Nov. 6, 2023

(87) PCT Pub. No.: WO2022/244268
PCT Pub. Date: Nov. 24, 2022

(65) Prior Publication Data
US 2024/0242918 A1      Jul. 18, 2024

(51) Int. Cl.
*H01J 37/07* (2006.01)
*H01J 37/063* (2006.01)
*H01J 37/08* (2006.01)

(52) U.S. Cl.
CPC ............ *H01J 37/07* (2013.01); *H01J 37/063* (2013.01); *H01J 37/08* (2013.01);
(Continued)

(58) Field of Classification Search
CPC .......... H01J 37/07; H01J 37/063; H01J 37/08; H01J 2237/038; H01J 2237/04735; H01J 2237/061
(Continued)

(56) References Cited

U.S. PATENT DOCUMENTS

| | | | |
|---|---|---|---|
| 4,396,861 A | 8/1983 | Hoffmeister et al. | |
| 2013/0140977 A1 | 6/2013 | Watanabe et al. | |
| 2013/0284948 A1* | 10/2013 | Iwamoto ............. | C04B 35/6455 |
| | | | 250/493.1 |

FOREIGN PATENT DOCUMENTS

| | | |
|---|---|---|
| JP | 2010/86861 A | 4/2010 |
| JP | 2014-214069 A | 11/2014 |

(Continued)

OTHER PUBLICATIONS

International Search Report (PCT/ISA/210) issued in PCT Application No. PCT/JP2021/019451 dated Jul. 6, 2021 with English translation (4 pages).
(Continued)

*Primary Examiner* — Michael Maskell
(74) *Attorney, Agent, or Firm* — Crowell & Moring LLP

(57) ABSTRACT

Provided are a structure for particle acceleration and a charged particle beam apparatus, which enable the suppression of electric field concentration occurring near a negative electrode part. The structure for particle acceleration includes: a ceramic body 1 having a through hole 10 formed by an inner wall surface; and a negative electrode 2 and a positive electrode 3 which are arranged, respectively, on one end and the other end of the through hole 10 in the ceramic body. The inner wall surface of the ceramic body 1 is configured such that a first region 22, which is electrically connected with the negative electrode 2, and a second region 23, which is electrically connected with the positive electrode 3, are electrically connected to each other. The surface
(Continued)

resistivity of the first region 22 is lower than the surface resistivity of the second region 23.

14 Claims, 9 Drawing Sheets

(52) U.S. Cl.
CPC ..................... *H01J 2237/038* (2013.01); *H01J 2237/04735* (2013.01); *H01J 2237/061* (2013.01)

(58) Field of Classification Search
USPC ........................................................ 250/493.1
See application file for complete search history.

(56) References Cited

FOREIGN PATENT DOCUMENTS

| | | |
|---|---|---|
| JP | 5787902 B2 | 9/2015 |
| WO | WO 2012/014370 A1 | 2/2012 |
| WO | WO 2012/091062 A1 | 7/2012 |

OTHER PUBLICATIONS

Japanese-language Written Opinion (PCT/ISA/237) issued in PCT Application No. PCT/JP2021/019451 dated Jul. 6, 2021 with English translation (5 pages).
Japanese-language Office Action issued in Japanese Application No. 2023-522188 dated Jun. 25, 2024 with English translation (6 pages).

\* cited by examiner

[FIG. 1]
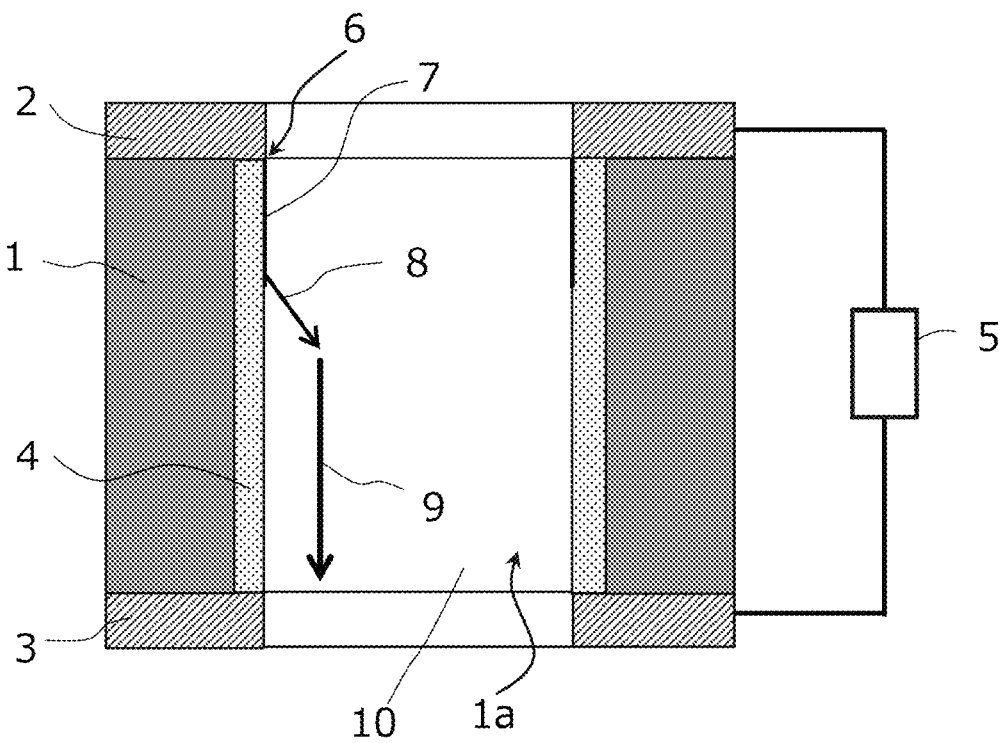

[FIG. 2]
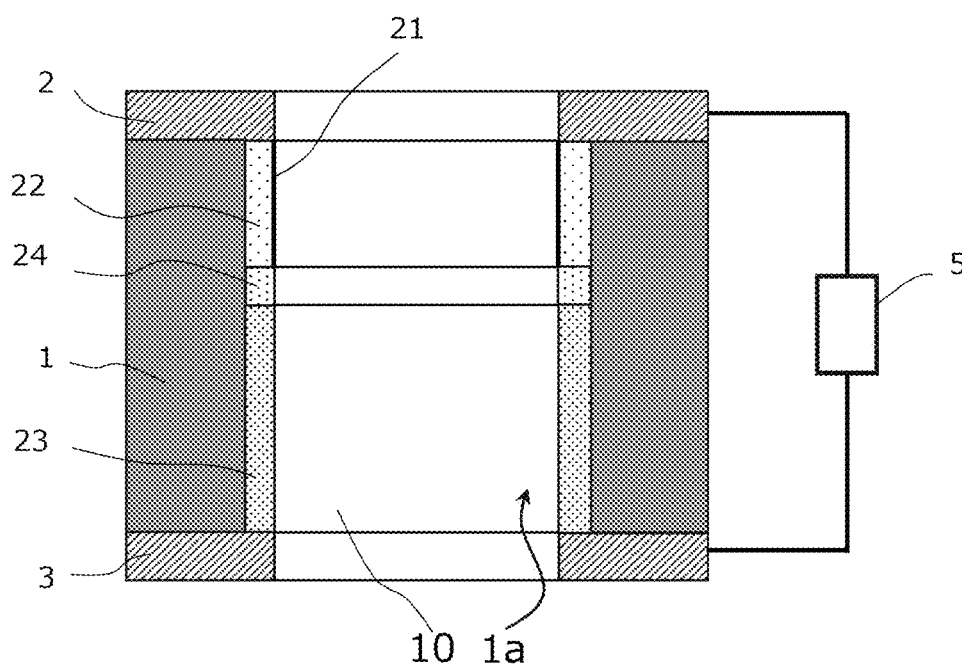

[FIG. 3]
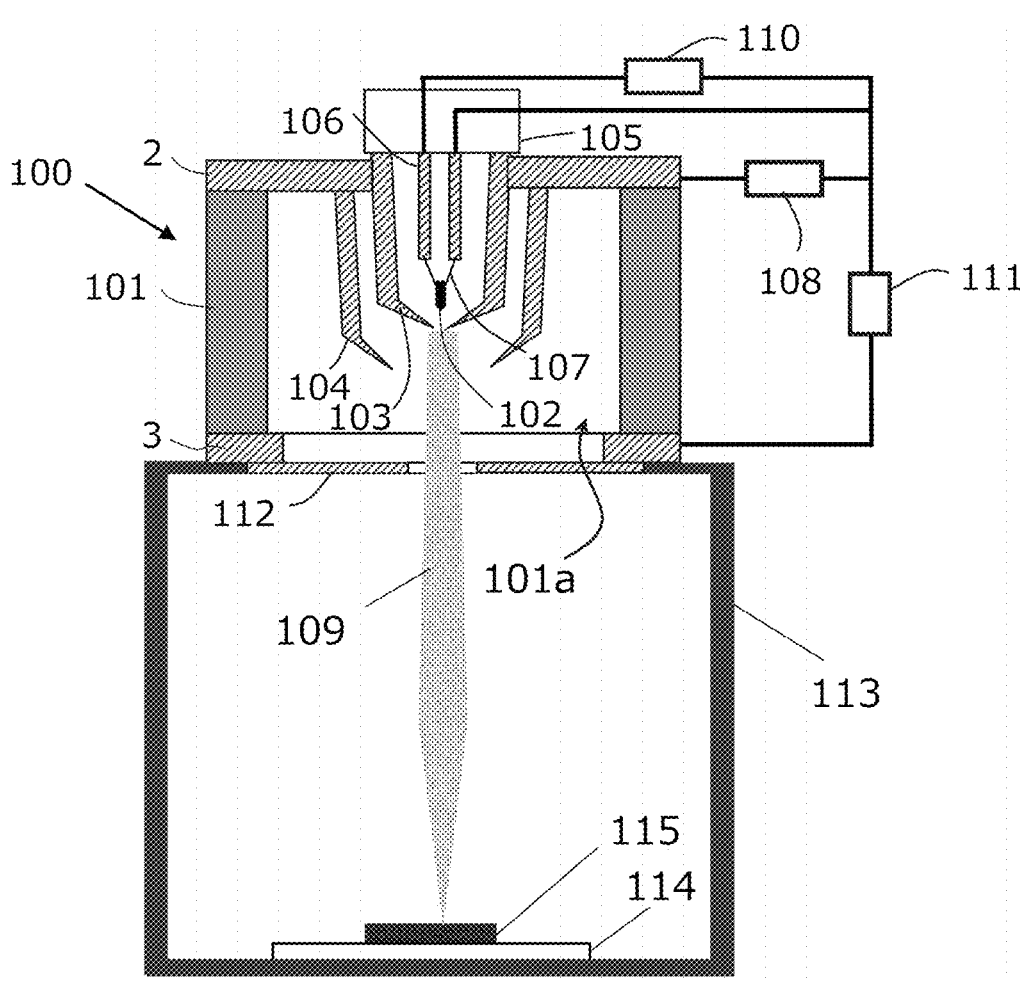

[FIG. 4A]
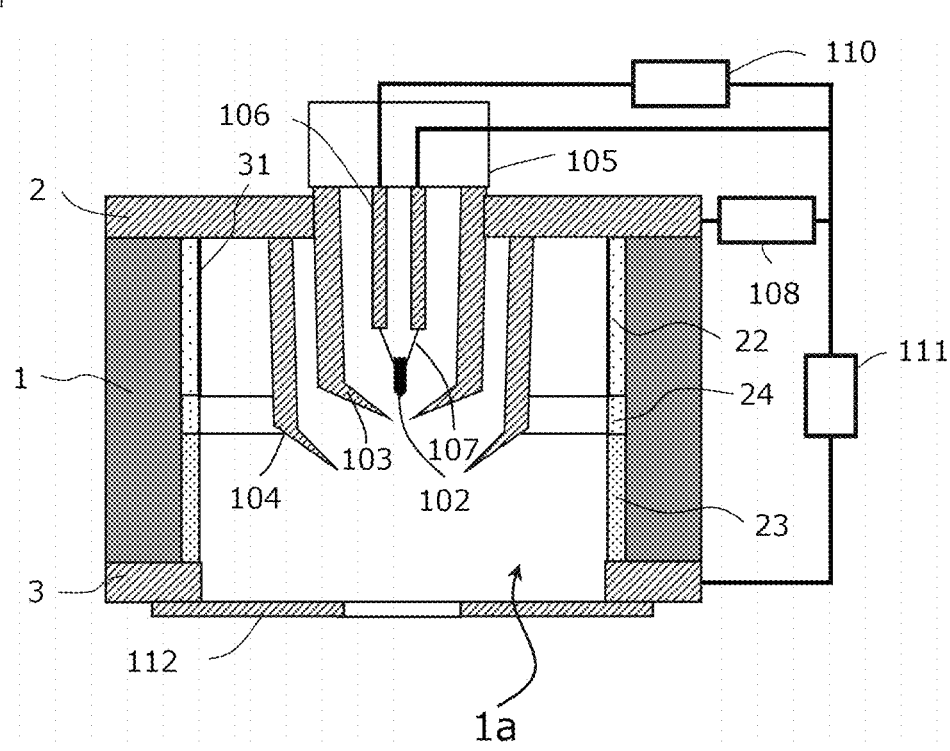

[FIG. 4B]
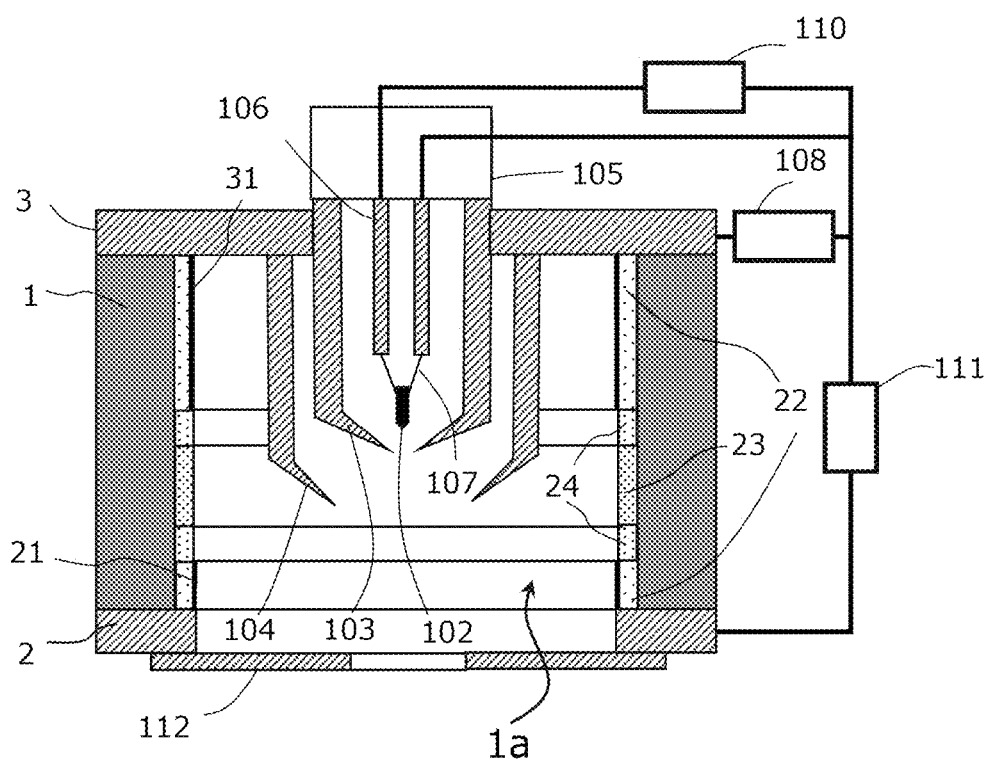

[FIG. 5A]
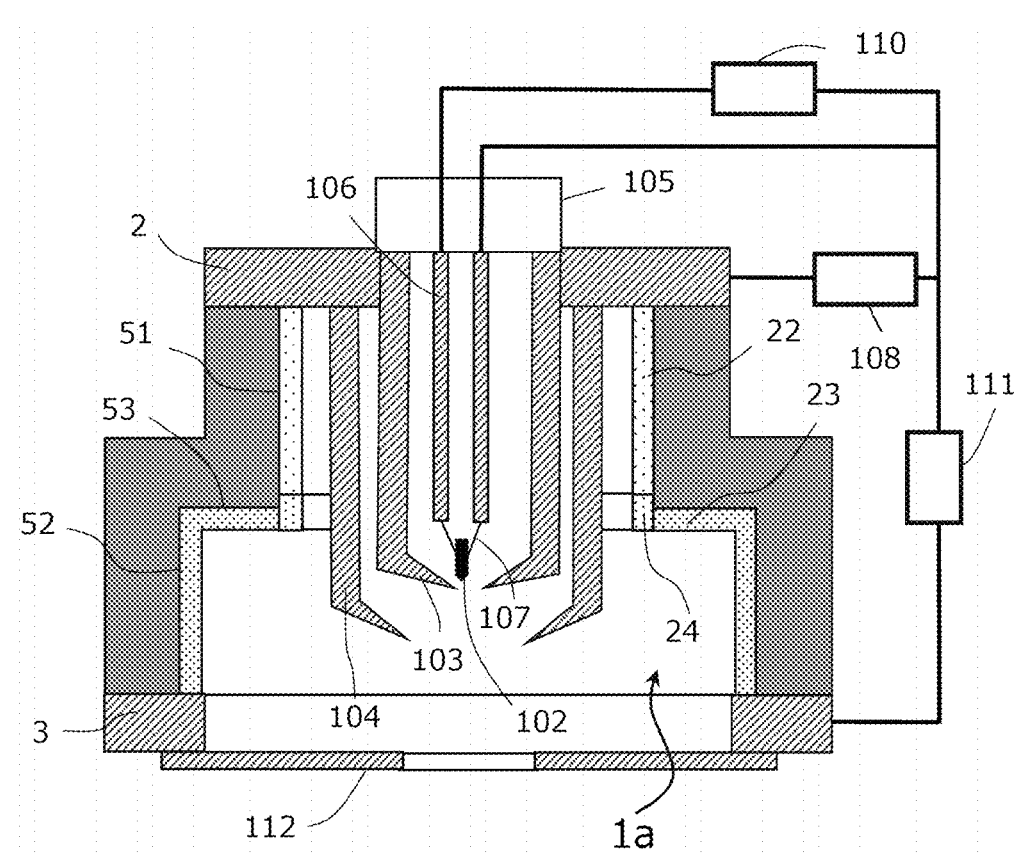

[FIG. 5B]
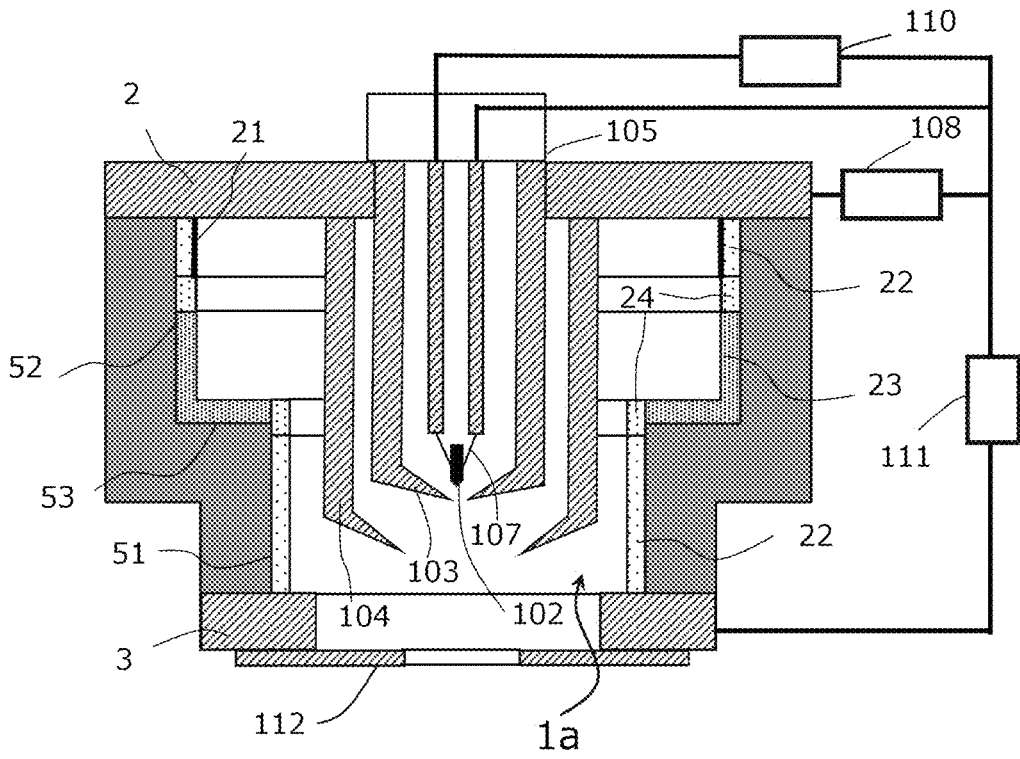

[FIG. 6A]
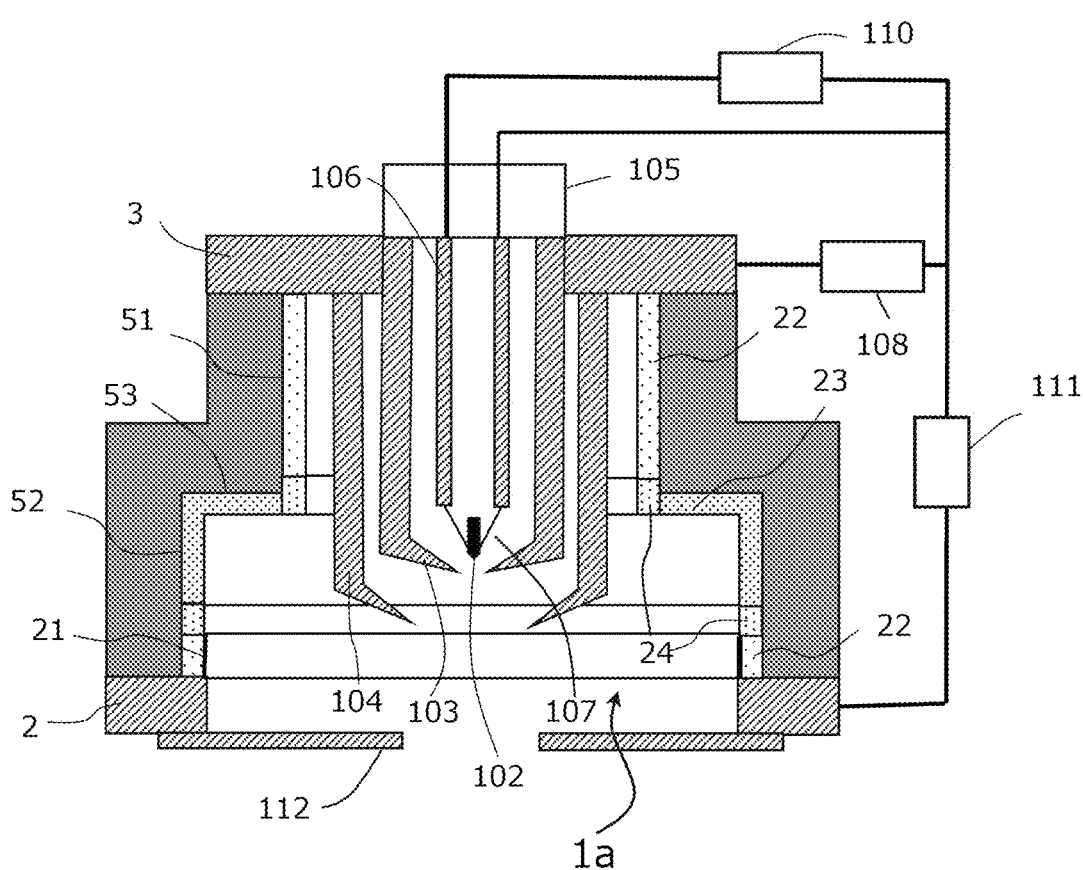

[FIG. 6B]
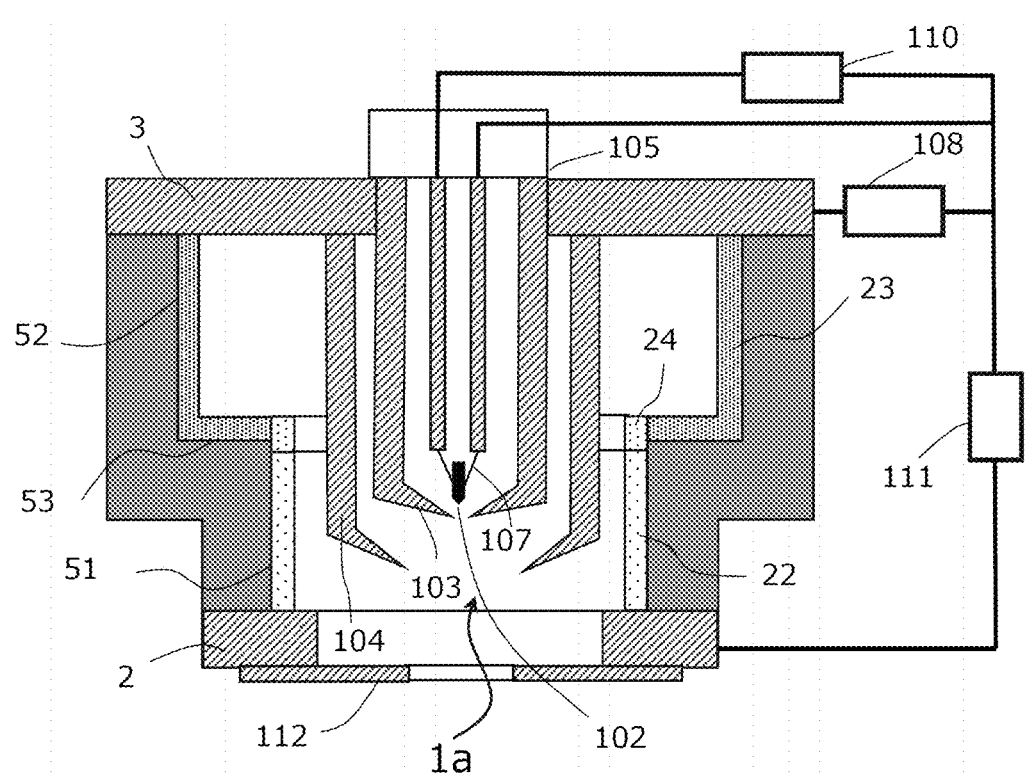

STRUCTURE FOR PARTICLE ACCELERATION AND CHARGED PARTICLE BEAM APPARATUS

TECHNICAL FIELD

The present invention relates to a structure for particle acceleration and a charged particle beam apparatus.

BACKGROUND ART

For example, a charged particle beam apparatus known as an electron gun or an ion gun generally uses an insulator having a resistance layer on the surface (inner wall surface) of a hollow ceramic body as a component of an acceleration unit for accelerating charged particles (electron beam or ion beam) emitted in a vacuum space. Such an insulator can connect an electrode pair including a cathode and an anode to a ceramic body and apply a predetermined voltage to the electrode pair to form a structure for particle acceleration that accelerates and outputs charged particles generated inside (in a vacuum space) of the ceramic body.

Meanwhile, there is a problem that the inner wall surface of the insulator described above has local discharge caused by accumulation (charge-up) of thermal electrons and reflection electrons emitted from structures placed in the vacuum space and subsequently lowered insulation resistance. To address such problem, for example, in the related art disclosed in PTL 1, a ceramic body with a resistance layer is used to permit a minute current to flow through the resistance layer, thereby preventing the charge-up. The surface resistivity of the resistance layer is adjusted to prevent the charge-up.

CITATION LIST

Patent Literature

PTL 1: JP5787902B

SUMMARY OF INVENTION

Technical Problem

Meanwhile, in an insulator for a charged particle device such as an electron gun, that is, in the insulator for a structure for particle acceleration that accelerates charged particles by applying a high voltage to an electrode pair, even the electric field concentration occurring by the application of high voltage may also cause discharge, which may result in deterioration of insulation resistance. Therefore, it is understood that it is difficult to reduce the electric field concentration only by adjusting the surface resistivity as in the related art.

In particular, a junction between the electrode and the insulator is called a "triple junction" which is a portion where the three elements including the vacuum space are joined, and in particular, the electric field concentration occurring near the cathode causes a significant deterioration of insulation resistance. Therefore, the triple junction, and particularly, the triple junction on the cathode side is a place where the reduction of electric field concentration is required.

When the insulator includes other structures inside, for example, when the insulator includes structures other than the electrode pairs described above, such as electrodes and electron sources for generating and controlling charged particle beams, electric field concentration inevitably occurs in a region near the structures. To reduce the electric field concentration, for example, measures such as changing the shape of the entire insulator or separating the inner wall of the ceramic body from the structure are required. However, such measures lead to an increase in the size of the insulator, and even the measure of separating the inner wall of the ceramic body from the structure has a limit (for example, distance limit), and it is actually difficult to adopt such measures.

Therefore, to solve the problems described above, there is a need for a structure and a charged particle beam apparatus, which enable the reduction of electric field concentration near the cathode and the surface near the structure, while maintaining the shape of the insulator.

An object of the present invention is to provide a structure for particle acceleration and a charged particle beam apparatus, which enable the reduction of electric field concentration occurring near the cathode part.

Solution to Problem

The following briefly explains the outline of a representative example of the invention disclosed in the present application.

A structure for particle acceleration according to a representative embodiment of the present invention includes a ceramic body having a through hole formed by an inner wall surface, a cathode provided on one end of the through hole in contact with the ceramic body, and an anode provided on the other end of the through hole in contact with the ceramic body, in which the inner wall surface of the ceramic body is electrically connected to a first region electrically connected to the cathode and a second region electrically connected to the anode, and the surface resistivity of the first region is lower than the surface resistivity of the second region.

Advantageous Effects of Invention

The effect obtained by a representative example of the invention disclosed in the present application will be briefly described as follows.

That is, according to the representative embodiment of the present invention, the possibility of occurrence of electric field concentration that causes discharge can be minimized. Therefore, it is possible to provide a structure for particle acceleration and a charged particle beam apparatus, which enable the reduction of electric field concentration occurring near the cathode part.

BRIEF DESCRIPTION OF DRAWINGS

FIG. 1 is a cross-sectional view showing a structure of a related-art insulator, which is provided to explain discharge caused by electric field concentration.

FIG. 2 is a cross-sectional view showing a specific example of an insulator as a structure for particle acceleration according to a first embodiment.

FIG. 3 is a view showing an overview of a charged particle beam apparatus according to a second embodiment.

FIG. 4A is a cross-sectional view provided to explain a detailed configuration of an electron gun shown in FIG. 3.

FIG. 4B is a cross-sectional view provided to explain an example in which the configuration of the second embodiment is applied to an ion gun.

FIG. 5A is a cross-sectional view showing an example of an electron gun according to a third embodiment equipped with a convex insulator.

FIG. 5B is a cross-sectional view of the electron gun equipped with the inverted convex insulator.

FIG. 6A is a cross-sectional view of an ion gun equipped with a convex insulator.

FIG. 6B is a cross-sectional view of an ion gun equipped with the inverted convex insulator.

DESCRIPTION OF EMBODIMENTS

Hereinafter, embodiments of the present invention will be described with reference to the drawings. Each of the embodiments described below is an example for implementing the present invention, and are not to be construed as limiting the technical scope of the present invention. In the modifications of the second embodiment and subsequent embodiments, the members having the same functions are designated by the same reference numerals, and the redundant description thereof will be omitted unless particularly necessary.

First Embodiment

In the first embodiment, an example in which a resistance layer is applied to an insulator included in an electron gun will be described. Note that a configuration described below can be applied in the same manner to the insulators used in ion guns, but in general, the ion guns emit positively charged ion particles, so the arrangement of the electrode pair (cathode and anode) is reversed from that of the electron gun. A specific configuration when applied to the ion gun will be described elsewhere below with reference to FIG. 4B and the like.

First, the reason that electric field concentration causes discharge will be described with reference to FIG. 1. FIG. 1 is a cross-sectional view showing a structure of a related-art insulator, which is provided to explain discharge caused by electric field concentration.

The insulator based on the related configuration shown in FIG. 1 serves as a structure for particle acceleration mounted on the electron gun. Specifically, the related-art structure for particle acceleration includes a ceramic body 1, a cathode 2 and an anode 3 arranged on upper and lower ends of the ceramic body 1, and a resistance layer 4 provided on an inner wall of the ceramic body 1.

The ceramic body 1 has a hollow cylindrical structure, and has a ring shape in plan view. The structure for particle acceleration has a through hole 10 defined (formed) by an inner wall surface of the ceramic body 1 and inner surfaces of the cathode 2 and the anode 3, and is used in a state that the space of the through hole 10 is in a substantially vacuum state (refer to FIG. 3 or the like, as appropriate).

The resistance layer 4 is formed on the surface (inner wall surface) of the ceramic body 1, with the cathode 2 connected to the upper end, and the anode 3 connected to the lower end. A power supply 5 applies a high voltage between electrodes (the cathode 2, the anode 3).

Here, the resistance layer 4 has a function of preventing charge-up and equalizing the equipotential lines, and the function improves the insulation resistance of the insulator and the structure for particle acceleration. Regarding a pair of electrodes 2 and 3, the cathode 2 may be called the "negative electrode" and the anode 3 may be called the "positive electrode" when distinguished between high and low voltages during voltage application.

Meanwhile, upon application of high voltage, electric field concentration often occurs near the cathode part that includes a triple junction 6 formed by the vacuum space of the cathode part 2, the resistance layer 4, and the through hole 10, forming a strong electric field region 7 in a region shown in a thick line in FIG. 1. As a result, there is a problem that electron emission 8 is induced from the strong electric field region 7 and the insulation resistance is deteriorated by creeping discharge 9.

The present inventors have made intensive studies on the problems and solutions described above, and as a result, have reached the following findings.

When the inner wall surface of the ceramic body 1 is formed as the resistance layer 4, upon application of high voltage to the pair of electrodes 2 and 3, the effect of preventing charge-up and equalizing equipotential lines can be obtained. Meanwhile, according to the related-art method, the surface resistivity of the resistance layer 4 is fixed (single value), and with such configuration, it is difficult to reduce local electric field concentration, especially local electric field concentration occurring in the vicinity 21 of the cathode part.

In more detail, it is difficult to configure (position and the like) a connecting portion between a lower end side of the inner wall surface of the ceramic body 1 and the anode 3 and a connecting portion between an upper end side of the inner wall surface of the ceramic body 1 and the cathode 2 on the same plane, and it was found that local electric field concentration is likely to occur when such a connecting portion has a corner portion (for example, a step or unevenness).

Even when the connecting portions are completely flush with each other, it was found that local electric field concentration inevitably occurs due to the fact that the contact state between the pair of electrodes 2 and 3 and the resistance layer 4 tends to be non-uniform due to thermal deformation, chipping of the resistance layer 4, and the like.

On the other hand, it was found that, by configuring such that the surface resistivity of the resistance layer 4 changes according to the location of the inner wall surface of the ceramic body 1, specifically according to a distance from the pair of electrodes 2 and 3, and from the cathode 2 in particular, it is possible to reduce the local electric field concentration and also reduce the local electric field concentration occurring in the vicinity 21 of the cathode part even when the contact state between the pair of electrodes 2 and 3 and the resistance layer 4 is not uniform as described above.

FIG. 2 shows a cross-sectional view of the structure of the insulator (structure for particle acceleration) according to the first embodiment. The structure for particle acceleration of the first embodiment is the same as in FIG. 1 in that the structure includes the ceramic body 1 having the through hole 10 formed by the inner wall surface, and the cathode 2 and the anode 3 are arranged on the upper end (one end) and the lower end (other end) of the through hole 10 in the ceramic body 1, respectively.

Meanwhile, in the structure for particle acceleration of the first embodiment, the surface resistivity ($\Omega/\square$) of the inner wall surface of the ceramic body 1 is set to different values according to the possibility of occurrence of electric field concentration (distance from the cathode 2, and the like). More specifically, the inner wall surface of the ceramic body 1 has a configuration in which a first region (upper region) electrically connected to the cathode 2 and a second region (lower region) electrically connected to the anode 3 are electrically connected by an electric field relaxation layer 24 using a known electric field relaxation member. Here, the surface resistivity of the first region (upper region) on the inner wall surface of the ceramic body 1 is lower than the surface resistivity of the second region (lower region). In the example shown in FIG. 2, a low resistance layer 22 is formed in the upper region, and a high resistance layer 23 is formed in the lower region of the inner wall surface of the ceramic body 1.

In a specific example, the surface resistivity ($\Omega/\square$) of the inner wall surface of the ceramic body 1 is $1 \times 10^9$ to $1 \times 10^{12}$ for the low resistance layer 22, and $1 \times 10^6$ or more and less than $1 \times 10^9$ for the high resistance layer 23. The surface resistivity ($\Omega/\square$) of the region of the electric field relaxation layer 24 connected between the low resistance layer 22 and the high resistance layer 23 changes continuously from the surface resistivity value of the low resistance layer 22 (first region) to the surface resistivity value of the high resistance layer 23 (second region) by the action of the electric field relaxation member.

Thus, by configuring the inner wall of the ceramic body 1 such that the low resistance layer 22 is formed in the vicinity 21 of the cathode part where electric field concentration is likely to occur, the high resistance layer 23 is formed in a region where electric field concentration occurs relatively rarely, and the low resistance layer 22 and the high resistance layer 23 are electrically connected to each other, the following effects can be achieved.

That is, with the configuration described above, upon application of high voltage from the power supply 5 to the pair of electrodes 2 and 3, a weak current flows through the inner wall surface of the ceramic body 1, from the anode 3 to the high resistance layer 23, the electric field relaxation layer 24, the low resistance layer 22, and the cathode 2 in this order (note that the flow of electrons is in the opposite direction). Here, the distribution of the voltage applied to the inner wall surface of the ceramic body 1 is uneven, and the voltage is lower in regions of low surface resistance (Ohm's law).

In the example, the amount of current (the amount of electrons) flowing into the upper low resistance layer 22 is the largest, so that the voltage applied to the upper inner surface region (that is, the range of the low resistance layer 22) of the ceramic body 1 is smaller than the voltage applied to the lower high resistance layer 23. Thus, by providing a region with a lower surface resistivity than the related art on one end side (in the example, on the upper side) of the ceramic body 1 that includes the triple junction of the cathode 2, a relatively smaller (lower) voltage portion can be ensured, and the voltage distribution of the high electric field portion can be moderated over the entire inner wall surface of the ceramic body 1. As a result, it is possible to reduce electric field concentration in the upper region that includes the triple junction of the cathode 2 in the ceramic body 1.

As a modification, the low resistance layer 22 and the high resistance layer 23 may be electrically connected to each other directly without providing the electric field relaxation layer 24. Meanwhile, here, according to the set values of the surface resistivities of the low resistance layer 22 and the high resistance layer 23, problems may occur due to a stepped change in the surface resistivity in a boundary region between the layers 22 and 23, that is, due to an abrupt change in the electrical characteristics. In view of the possibility of such a problem, as described above, it is desirable to adopt a configuration in which the low resistance layer 22 and the high resistance layer 23 are electrically connected by the electric field relaxation layer 24 as the electric field relaxation region, and the surface resistivity of the boundary region between the low resistance layer 22 and the high resistance layer 23 changes gradually (electrical characteristics change smoothly).

According to the first embodiment having the configuration described above, a structure for particle acceleration is obtained in which electric field concentration in the vicinity 21 of the cathode part is reduced upon application of high voltage to the pair of electrodes 2 and 3. By providing the structure for particle acceleration with a beam emitter that emits a charged particle beam, it is possible to obtain a charged particle beam apparatus (electron gun, ion gun, and the like) with high insulation resistance that can avoid unnecessary discharge during operation.

Second Embodiment

Next, configuration according to a second embodiment will be described. In the second embodiment, a configuration example in which a structure that forms an electron gun or an ion gun is disposed inside an insulator (a space within the through hole of the ceramic body) mounted in the charged particle beam apparatus will be described.

First, a specific example of the structure of the electron gun as the charged particle beam apparatus will be described with reference to FIG. 3. The electron gun includes an insulator 100 of a ceramic body 101 (the structure of the inner wall surface will not be mentioned here), a pair of electrodes including the cathode 2 and the anode 3 arranged on an upper end and a lower end of a through hole 101a in the ceramic body 101, respectively, and a structure (beam emitter) including various electrodes attached to the cathode 2.

As can be seen in comparison with the examples of FIGS. 1 and 2 described above, in the insulator 100 shown in FIG. 3, the cathode 2 is provided with a structure forming a part of the electron gun, and accordingly, the diameter of the opening provided in the cathode 2 is smaller than the diameter of the through hole 101a of the ceramic body 101. Since an anode electrode 112 is disposed on the anode 3, the diameter of the opening in the anode 3 is also smaller than the diameter of the through hole 101a of the ceramic body 101.

In the example shown in FIG. 3, the cathode 2 is provided with a control electrode 104 and an extraction electrode 103 from the outside in FIG. 3, which are arranged to extend downward within the through hole 101a of the ceramic body 101, respectively. The tip side of each of the control electrode 104 and the extraction electrode 103 has a tapered shape, and is bent in a direction toward the center of the insulator 100 in plan view.

The control electrode 104 controls the electric field around an electron source 102, which will be described below, is disposed on (electrically connected to) the lower surface of the cathode 2, and is applied with a high voltage by power supplied from an extraction voltage power supply 108 and an acceleration voltage power supply 111.

Meanwhile, the extraction electrode 103 is electrically connected to the cathode 2 by being fitted into an opening of the cathode 2, for example. An upper end (base end) of the extraction electrode 103 is attached to a high voltage introduction part 105 made of an insulator to be separated from a high voltage introduction terminal 106 which will be described below.

The electron source 102, a heater wire 107, and the high voltage introduction terminal 106 are electrically connected to each other and arranged inside the extraction electrode 103. Here, the upper end (base end) of the high voltage introduction terminal 106 is attached to the high voltage introduction part 105 and electrically connected to a heating voltage power supply 110 and the acceleration voltage power supply 111. The electron source 102 emits an electron beam 109 by applying a voltage between the electron source 102 and the extraction electrode 103 by the extraction voltage power supply 108 (see FIG. 3). Here, the voltage (third voltage) applied between the electron source 102 and the extraction electrode 103 is equal to or less than the voltage applied to the pair of electrodes 2 and 3 by the power supply 5 described above with reference to FIGS. 1 and 2. More specifically, the third voltage described above is equal to or lower than the voltage (first voltage) measured at the cathode 2 when the voltage of the power supply 5 is applied, and is also lower than the voltage (second voltage) measured at the anode 3.

The electron source 102 is attached to the heater wire 107 through the high voltage introduction terminal 106. The heater wire 107 is connected to the heating voltage power supply 110 through the high voltage introduction terminal 106 and cables or the like, and generates heat with power from the heating voltage power supply 110 to flush the electron source 102.

Meanwhile, the anode electrode 112 that is electrically connected to the anode 3 and has an opening with a diameter that allows the electron beam 109 to pass through, and a vacuum container 113 that introduces the electron beam 109 passing through the anode electrode 112 are provided on the lower surface side of the anode 3. A sample table 114 is provided in the vacuum container 113, and a sample 115 to be irradiated with the electron beam 109 is placed on the sample table 114.

Thus, the electron gun as the charged particle beam apparatus is operated in a state where the internal space is in an ultra-high vacuum of $1\times10^{-8}$ (pa) or less. Then, the electron beam 109 emitted from the electron source 102 is accelerated by the anode electrode 112 applied with the high voltage by the acceleration voltage power supply 111, and irradiated onto the sample 115 on the sample table 114 in the vacuum container 113 to process the sample 115. Here, the electric field around the electron source 102 is controlled by applying a voltage to the control electrode 104 by the extraction voltage power supply 108, so that the traveling direction of the electron beam 109 and thus the irradiation position on the sample 115 can be adjusted.

Next, the configuration of the charged particle beam apparatus according to the second embodiment will be described with reference to FIGS. 4A and 4B. FIG. 4A is a cross-sectional view provided to explain the detailed configuration of the electron gun shown in FIG. 3.

Like the first embodiment, in the second embodiment, the low resistance layer 22 and the high resistance layer 23 are provided on the inner wall surface of the ceramic body 1, and the electric field relaxation layer 24 is disposed between the resistance layers 22 and 23 for electrical connection. Other configurations are the same as those described with reference to FIG. 3, and the vacuum container 113 described above with reference to FIG. 3 can be used.

As described above, in the electron gun as the charged particle beam apparatus, conductive structures forming the main parts of the electron gun, such as the electron source 102, the extraction electrode 103, and the control electrode 104, are disposed inside the insulator (inside a through hole 1*a* defined by the inner wall surface of the ceramic body 1).

Because the voltage is also applied to the structure mentioned above when the electron gun is in operation, there is a problem that electric field concentration is likely to occur on the inner wall surface of the ceramic body 1, and particularly in a region 31 (see FIG. 4A) near the structure. From another point of view, it can be said that the region 31 near the structure is the region of the inner wall of the ceramic body 1 from a position in contact with the cathode 2 to a position where the distance from the structure (the control electrode 104 in the example) is within a certain value.

To reduce the electric field concentration, in the electron gun according to the second embodiment, as shown in FIG. 4A, on the inner wall surface of the ceramic body 1, the low resistance layer 22 is formed in the region 31 near a structure, and the high resistance layer 23 is provided in the other region with the electric field relaxation layer 24 interposed therebetween. With the electron gun having the above configuration according to the second embodiment, it is possible to significantly prevent the occurrence of electric field concentration in the region 31 near the structure, and also the entire inner wall surface of the ceramic body 1 during operation.

FIG. 4B is a cross-sectional view provided to explain a detailed configuration of an ion gun that emits ion beams. As described above, since the ion gun emits a beam of positive ions, the arrangement of the electrodes is opposite to that of the electron gun. That is, in the drawing where the structure is disposed, the anode 3 is disposed on the upper side, and the cathode 2 is disposed on the lower side. Since the other basic structures of the ion gun are the same as those of the electron gun, the same or similar parts are denoted by the same reference numerals, and description thereof will be omitted as appropriate.

Meanwhile, the ion gun has technical challenges of both the reduction of electric field concentration occurring in the region 31 near the structure and the reduction of electric field concentration in the vicinity 21 of the cathode part (see FIG. 4B). That is, for the ion gun in which the electrode arrangement is reversed, since the region 31 near the structure is on the upper side of the insulator (the anode 3 side), and a vicinity 21 of the cathode part where electric field concentration is likely to occur is on the lower side of the insulator, portions where electric field concentration is likely to occur are present on both the upper side and the lower side of the inner wall surface of the ceramic body 1.

For the ion gun, it can be said that the region 31 near the structure is the region of the inner wall of the ceramic body 1 from a position in contact with the anode 3 to a position at a predetermined height or to a position separated from the structure (the control electrode 104) by a predetermined distance.

To solve such problem, in the ion gun according to the second embodiment, as shown in FIG. 4B, on the inner wall surface of the ceramic body 1, the low resistance layer 22 is formed in the region 31 near a structure, and the high resistance layer 23 is provided in the other region with the electric field relaxation layer 24 interposed therebetween. With the ion gun having the above configuration according to the second embodiment, it is possible to significantly prevent the occurrence of electric field concentration in both the region 31 near the structure and the vicinity 21 of the cathode part, and also the entire inner wall surface of the ceramic body 1 during operation.

As described above, with the structure of the second embodiment, it is possible to implement an electron gun and an ion gun with high insulation resistance that avoid discharge even when internal structures are close to each other.

Third Embodiment

Next, configuration according to a third embodiment will be described with reference to FIGS. 5A to 6B. Here, FIG. 5A is a cross-sectional view showing an example of an electron gun according to the third embodiment equipped with a convex insulator.

Meanwhile, FIG. 5B is a cross-sectional view of the electron gun equipped with an inverted convex insulator. FIG. 6A is a cross-sectional view of an ion gun equipped with a convex insulator, and FIG. 6B is a cross-sectional view of the ion gun equipped with an inverted convex insulator.

It is known that the insulation resistance of the insulator is improved by extending the creepage distance of the inner wall surface to reduce electric field concentration. The insulator (ceramic body) described in the third embodiment adopts a shape having a longer creepage distance than the insulator (ceramic body) described with reference to FIGS. 1 to 4B. An additional effect of such a shape is that it can contribute to miniaturization of the electron gun or the ion gun.

Note that in the third embodiment, the electric field relaxation layer 24 is disposed between the low resistance layer 22 and the high resistance layer 23 for electrical connection, as in the first and second embodiments described above. In the third embodiment, for the same reason as in the second embodiment described above, the diameter of the opening provided in the pair of electrodes (the cathode 2 and the anode 3) is smaller than the diameter of the corresponding end side of the ceramic body 101.

As can be seen by comparison with the configurations of FIGS. 4A and 4B described above, the third embodiment shown in FIGS. 5A to 6B is a configuration example in which the shape of the insulator (mainly, the ceramic body) is changed to a convex shape with a wide lower side or an inverted convex shape with a wide upper side for the charged particle beam apparatus. Therefore, the inner wall surface of the insulator (ceramic body) of the third embodiment has a hollow structure including a small diameter portion 51 with a relatively smaller diameter, a large diameter portion 52 with a relatively larger diameter, and a connecting portion 53 that connects the small diameter portion 51 and the large diameter portion 52.

The electron gun equipped with the convex insulator shown in FIG. 5A is configured such that the low resistance layer 22 is provided in a region of the small diameter portion 51, the high resistance layer 23 is provided in a region of the large diameter portion 52 and the connecting portion 53, and the electric field relaxation layer 24 is disposed in a boundary portion between the resistance layers 22 and 23. More specifically, the inner wall of the insulator (ceramic body) according to the third embodiment is a portion where the connecting portion between the small diameter portion 51 and the connecting portion 53 is bent in a convex shape, and the electric field relaxation layer 24 is disposed in the connecting portion to stabilize the electrical characteristics at the bent portion upon application of high voltage (see also FIGS. 5B, 6A, and 6B as appropriate).

According to the structure and the charged particle beam apparatus the configurations described above, the electric field formed on the inner wall surface of the insulator can be dispersed, and electric field concentration can be reduced. As can be seen by comparison with FIG. 4A, even when the structure is closer to the inner surface of the insulator, it is possible to implement an electron gun with high insulation resistance that avoids discharge, and to reduce the size of the top and height of the insulator.

Meanwhile, in the electron gun equipped with the inverted convex insulator shown in FIG. 5B, as can be seen by comparison with FIG. 4A, since the region of the small diameter portion 51 on the inner wall surface of the insulator (ceramic body) is closer to the tip side of the structure, there is a concern that electric field concentration may occur in the region of the small diameter portion 51 in the related-art configuration. Although the large diameter portion 52 on the inner wall surface of the insulator (ceramic body) ensures a distance from the structure, there is a concern that electric field concentration may occur in the region in the vicinity 21 of the cathode part depending on the state of the triple junction on the cathode part side as described above. In other words, in the electron gun equipped with the inverted convex insulator shown in FIG. 5B, there are a plurality of regions (two upper and lower regions in the example) in which electric field concentration may occur.

Here, as shown in FIG. 5B, the low resistance layer 22 is formed in the regions of the inner wall surface of the insulator (ceramic body) where electric field concentration may occur, that is, in each region of the small diameter portion 51 near the structure and the vicinity 21 of the cathode part in the example, and the high resistance layer 23 is formed in the other regions with the electric field relaxation layer 24 interposed therebetween.

From another point of view, in the example shown in FIG. 5B, the low resistance layer 22 (first region) is provided from a position in contact with the cathode 2 to a midway height position of the large diameter portion 52, and the high resistance layer 23 (second region) is provided in the remaining region of the large diameter portion 52 and the connecting portion 53 with the electric field relaxation layer 24 (fifth region) interposed therebetween. The low resistance layer 22 (fourth region) is provided in the small diameter portion 22 with the electric field relaxation layer 24 (fifth region) interposed therebetween. Here, the upper (cathode 2) side low resistance layer 22 (first region) and the lower (anode 3) side low resistance layer 22 (fourth region) may have the same or different surface resistivities ($\Omega/\square$). The setting range of the surface resistivity ($\Omega/\square$) of the low resistance layer 22 (first region, fourth region) is $1 \times 10^6$ or more and less than $1 \times 10^9$. The setting range of the surface resistivity ($\Omega/\square$) of the high resistance layer 23 (second region) is $1 \times 10^9$ to $1 \times 10^{12}$.

According to the structure and the charged particle beam apparatus having the configurations described above, the electric field formed on the inner wall surface of the insulator can be dispersed, and electric field concentration can be reduced. As can be seen by comparison with FIG. 4A, even when the tip side of the structure is closer to the inner surface of the insulator, it is possible to implement an electron gun with high insulation resistance that avoids discharge, and to reduce the size of the lower portion and height of the insulator.

The ion gun equipped with a convex insulator shown in FIG. 6A differs from the electron gun shown in FIG. 5A in that the positions of the cathode 2 and the anode 3 are opposite, but is similar in that the low resistance layer 22 is provided in the small diameter portion 51, which is a region near the structural portion, and that the high resistance layer 23 is provided in the connecting portion 53. Meanwhile, as described above with reference to FIG. 4B, for the ion gun, it is necessary to reduce electric field concentration in the vicinity 21 of the cathode part on the lower side of the insulator (ceramic body). Therefore, in the example shown in FIG. 6A, the low resistance layer 22 is also provided in the region in the vicinity 21 of the cathode part on the lower side of the inner wall surface of the ceramic body. As a result, there are two connection regions between the low resistance layer 22 and the high resistance layer 23, in the small diameter portion 51 and the large diameter portion 52, and there are the electric field relaxation layers 24 provided in the two connection regions.

From another point of view, in the example shown in FIG. 6A, the low resistance layer 22 is disposed (set as the first region) from a position in contact with the cathode 2 to a midway height position of the large diameter portion 52, and the high resistance layer 23 is disposed (set as the second region) in the rest of the large diameter portion 52 with the electric field relaxation layer 24 (the fifth region) interposed therebetween, and the low resistance layer 22 is disposed (set as the third region) in the small diameter portion 51. Here, the lower (cathode 2) side low resistance layer 22 (first region) and the upper (anode 3) side low resistance layer 22 (third region) may have the same or different surface resistivities ($\Omega/\square$). The setting range of the surface resistivity ($\Omega/\square$) of the low resistance layer 22 (first region, third region) is $1\times10^6$ or more and less than $1\times10^9$. The setting range of the surface resistivity ($\Omega/\square$) of the high resistance layer 23 (second region) is $1\times10^9$ to $1\times10^{12}$.

With such a configuration, the electric field formed on the inner wall surface of the insulator can be dispersed, and electric field concentration can be reduced. As can be seen by comparison with FIG. 4B, even when the structure is closer to the inner surface of the insulator, it is possible to implement an ion gun with high insulation resistance that avoids discharge, and to reduce the size of the top and height of the insulator.

The ion gun equipped with the inverted convex insulator shown in FIG. 6B differs from the electron gun shown in FIG. 5B in that the positions of the cathode 2 and the anode 3 are opposite, but is similar in that the low resistance layer 22 is provided in the small diameter portion 51, which is a region near the tip side of the structural portion, and that the high resistance layer 23 is provided in the connecting portion 53. The ion gun differs from the electron gun shown in FIG. 5B in that the anode 3 is disposed on the upper end side of the inner wall surface of the insulator (ceramic body), and in the example shown in FIG. 6B, since the upper end side of the inner wall surface is the large diameter portion 52 and the distance from the structure is ensured, it is not necessary to provide the low resistance layer 22.

From another point of view, in the example shown in FIG. 6B, the low resistance layer 22 (first region) is disposed in the small diameter portion 22, the high resistance layer 23 (second region) is disposed in the large diameter portion 52 and the connecting portion 53, and the electric field relaxation layer 24 (fifth region) is provided in the connection region between the low resistance layer 22 and the high resistance layer 23. As described above, the set value of the surface resistivity ($\Omega/\square$) of the low resistance layer 22 (first region) can be in the range of $1\times10^6$ or more and less than $1\times10^9$, and the setting range of the surface resistivity ($\Omega/\square$) of the high resistance layer 23 (second region) can be $1\times10^9$ to $1\times10^{12}$.

Thus, with the configuration shown in FIG. 6B, the electric field formed on the inner wall surface of the insulator can be dispersed, and electric field concentration can be reduced. As can be seen by comparison with FIG. 4B, even when the tip side of the structure is closer to the inner surface of the insulator, it is possible to implement an ion gun with high insulation resistance that avoids discharge, and to reduce the size of the lower portion and height of the insulator.

As described above, according to the configuration of the third embodiment, it is also possible to obtain an electron gun and an ion gun with high insulation resistance by using the insulator (ceramic body) having a convex shape and an inverted convex shape that includes a structure inside and ensures a creepage distance.

As a modification of the third embodiment, the inner wall surface of the insulator (ceramic body) and the through hole may have a truncated cone shape (or an inverted truncated cone shape). Such a shape eliminates the convexly bent portion (connection portion between the small diameter portion and the connecting portion) described above, thereby increasing the degree of freedom in disposing the electric field relaxation layer 24 and, in turn, disposing the low resistance layer 22 and the high resistance layer 23. Here, when it is assumed that the maximum diameter and minimum diameter of the inner wall surface (through hole) of the insulator (ceramic body) are the same as in the examples of FIGS. 5A to 6B, it is conceivable to set the height dimension of the low resistance layer 22 and the like as follows to obtain the same effect as described above.

When the structure of FIG. 5A is used as a base, the low resistance layer 22 is provided on the inner wall surface of the truncated cone shape of the ceramic body from a contact position with the cathode 2 to a height position that is somewhat distant from the structure of the electron gun (which can be set slightly shorter than the example of FIG. 5A), and the high resistance layer 23 may be provided on the rest of the inner wall surface with the electric field relaxation layer 24 interposed therebetween. When the electron gun is based on the configuration of FIG. 5B, the upper (cathode 2 side) low resistance layer 22 can be set slightly longer than the example in FIG. 5B, and the lower (anode 3 side) low resistance layer 22 can be set slightly shorter than in the example in FIG. 5B. When the ion gun is based on the configuration of FIG. 6A, mainly the upper (anode 3 side) low resistance layer 22 can be set slightly shorter than the example of FIG. 6A. When the ion gun is based on the configuration of FIG. 6B, mainly the height of the lower (cathode 2 side) low resistance layer 22 can be set slightly lower than in the example of FIG. 6B.

Meanwhile, since the suitable dimensions in the area or height direction of the low resistance layer 22 and the high resistance layer 23 may vary according to the surface resistivity ($\Omega/\square$) to be set, the material to be used, the thickness of the layer, and the like, the dimensions are not necessarily limited to the setting policies described above. In general, in an environment where a high voltage is applied, it is desirable to ensure the height dimension of the high resistance layer 23 to the extent that large current leakage (so-called short circuit) does not occur in the vacuum space, and the height dimension of the low resistance layer 22 is set to a dimension that prevents the occurrence of electric field concentration as much as possible.

As described above, in the present disclosure, by adopting a configuration in which two or more regions with different surface resistivities are formed on the inner wall of the insulator (ceramic body), and in particular, in which the low resistance layer 22 is introduced near the cathode part that includes the triple junction where the risk of dielectric breakdown is high, a structure for particle acceleration was achieved which can effectively reduce electric field concentration that can occur when the high voltage is applied.

With respect to the electric field concentration or strong electric field that occurs when the structure for particle acceleration includes a structure such as an electrode that is a component of an electron gun or an ion gun, or when it is intended to reduce the size of the structure for particle acceleration, by dividing the region into the low resistance layer 22 and the high resistance layer 23, a structure for particle acceleration that enables the reduction of electric field concentration on the entire inner wall surface and avoids unnecessary discharge was achieved.

Therefore, according to the present disclosure, it is possible to provide a structure for particle acceleration and a charged particle beam apparatus, which enable the reduction of electric field concentration occurring near the cathode part.

Note that the present invention is not limited to the first, second, and third embodiments described above, and includes various modifications. For example, the embodiments described above have been described with respect to the configurations specifically adapted to electron guns or ion guns for easy understanding of the present invention. Accordingly, the present invention is not necessarily limited to those having all the configurations described above. A part of the configuration of an embodiment can be replaced with the configuration of another embodiment, and the configuration of another embodiment can be added to the configuration of an embodiment.

REFERENCE SIGNS LIST 1 ceramic body
2 electrode (cathode)
3 electrode (anode)
4 resistance layer
5 power supply
6 triple junction
7 strong electric field region
8 electron emission
9 creeping discharge
10 through hole
21 vicinity of cathode part
22 low resistance layer (first region)
23 high resistance layer (second region)
24 electric field relaxation layer (fifth region)
31 region near the structure
51 small diameter portion
52 large diameter portion
53 connecting portion
102 electron source
103 extraction electrode
104 control electrode
105 high voltage introduction part
106 high voltage introduction terminal
107 heater wire
108 extraction voltage power supply
109 electron beam
110 heating voltage power supply
111 acceleration voltage power supply
112 anode electrode
113 vacuum container
114 sample table
115 sample

The invention claimed is:
1. A structure for particle acceleration comprising:
a ceramic body having a through hole formed by an inner wall surface;

a cathode provided on one end of the through hole in contact with the ceramic body; and
an anode provided on the other end of the through hole in contact with the ceramic body, wherein
the inner wall surface of the ceramic body is electrically connected to a first region electrically connected to the cathode and a second region electrically connected to the anode, and
a surface resistivity of the first region is lower than a surface resistivity of the second region.
2. A charged particle beam apparatus comprising the structure for particle acceleration according to claim 1.
3. The charged particle beam apparatus according to claim 2, wherein
a beam emitter is provided in a space inside the through hole of the ceramic body, and
the beam emitter emits a charged particle beam by applying a voltage lower than a voltage applied to the anode and equal to or lower than a voltage applied to the cathode.
4. The charged particle beam apparatus according to claim 3, wherein
the beam emitter is an electron gun structure that emits an electron beam, and
the first region is set on an inner wall of the ceramic body from a position in contact with the cathode to a position at a distance from the structure by a predetermined value.
5. The charged particle beam apparatus according to claim 3, wherein
the beam emitter is an ion gun structure that emits an ion beam,
a region on the inner wall of the ceramic body from a position in contact with the anode to a predetermined height position or to a position separated from the structure by a predetermined distance forms a third region, and
a surface resistivity of the third region is lower than the surface resistivity of the second region.
6. The charged particle beam apparatus according to claim 4, wherein
the inner wall of the ceramic body includes a small diameter portion with a relatively smaller inner diameter and a large diameter portion with a relatively larger inner diameter, and
the first region is set in the small diameter portion, and the second region is set in the large diameter portion.
7. The charged particle beam apparatus according to claim 4, wherein
the inner wall of the ceramic body includes a large diameter portion with a relatively larger inner diameter and a small diameter portion with a relatively smaller inner diameter,
the first region is set from a position in contact with the cathode to a midway position of the large diameter portion,
a region in the small diameter portion formed from a position in contact with the anode to a position at a distance from the structure by a predetermined value forms a fourth region, and
a surface resistivity of the fourth region is lower than the surface resistivity of the second region.
8. The charged particle beam apparatus according to claim 5, wherein the inner wall of the ceramic body includes a small diameter portion with a relatively smaller inner diameter and a large diameter portion with a relatively larger inner diameter, and a portion from a position in contact with the cathode to a midway height position of the large diameter portion is set in the first region, the rest of the large diameter portion is set in the second region, and the small diameter portion is set in the third region.

9. The charged particle beam apparatus according to claim 5, wherein the inner wall of the ceramic body includes a large diameter portion with a relatively larger inner diameter and a small diameter portion with a relatively smaller inner diameter, and the first region is disposed in the small diameter portion and the second region is disposed in the large diameter portion.

10. The charged particle beam apparatus according to claim 2, wherein the second region has a surface resistivity ($\Omega/\square$) of $1\times10^9$ to $1\times10^{12}$, and the first region has a surface resistivity ($\Omega/\square$) of $1\times10^6$ or more and less than $1\times10^9$.

11. The charged particle beam apparatus according to claim 2, wherein an inner wall of the ceramic body includes a fifth region electrically connecting the first region and the second region, and the fifth region is an electric field relaxation region that continuously changes a surface resistivity from the surface resistivity of the first region to the surface resistivity of the second region.

12. The charged particle beam apparatus according to claim 11, wherein the electric field relaxation region is set at a position where the inner wall of the ceramic body is bent in a convex shape.

13. The charged particle beam apparatus according to claim 5, wherein the first surface resistivity ($\Omega/\square$) is $1\times10^6$ or more and less than $1\times10^9$, the second surface resistivity ($\Omega/\square$) is $1\times10^9$ to $1\times10^{12}$, and the third surface resistivity ($\Omega/\square$) is $1\times10^6$ or more and less than $1\times10^9$.

14. The charged particle beam apparatus according to claim 7, wherein the first surface resistivity ($\Omega/\square$) is $1\times10^6$ or more and less than $1\times10^9$, the second surface resistivity ($\Omega/\square$) is $1\times10^9$ to $1\times10^{12}$, the third surface resistivity ($\Omega/\square$) is $1\times10^6$ or more and less than $1\times10^9$, and the fourth surface resistivity ($\Omega/\square$) is $1\times10^6$ or more and less than $1\times10^9$.

\* \* \* \* \*